United States Patent

Hattangady et al.

[11] Patent Number: 5,970,345
[45] Date of Patent: Oct. 19, 1999

[54] METHOD OF FORMING AN INTEGRATED CIRCUIT HAVING BOTH LOW VOLTAGE AND HIGH VOLTAGE MOS TRANSISTORS

[75] Inventors: Sunil V. Hattangady, McKinney; George R. Misium, Plano, both of Tex.

[73] Assignee: Texas Instruments Incorporated, Dallas, Tex.

[21] Appl. No.: 09/177,424

[22] Filed: Oct. 22, 1998

Related U.S. Application Data

[60] Provisional application No. 60/062,627, Oct. 22, 1997.

[51] Int. Cl.⁶ ................................................. H01L 21/336
[52] U.S. Cl. ........................................ 438/279; 438/981
[58] Field of Search .................................... 438/201, 241, 438/258, 264, 266, 263, 275, 277, 279, 283, 431, 437, 588, 594, 981, 227

[56] References Cited

U.S. PATENT DOCUMENTS

| 4,851,370 | 7/1989 | Doklan et al. ........................... 437/225 |
| 5,665,620 | 9/1997 | Nguyen et al. .......................... 438/593 |
| 5,716,863 | 2/1998 | Arai ........................................ 438/238 |

FOREIGN PATENT DOCUMENTS

| 0 697 716 A2 | 2/1996 | European Pat. Off. . |
| 0 715 344 A2 | 6/1996 | European Pat. Off. . |
| 0 751 559 A1 | 1/1997 | European Pat. Off. . |
| 07 183409 | 7/1995 | Japan . |

*Primary Examiner*—Charles Bowers
*Assistant Examiner*—Jack Chen
*Attorney, Agent, or Firm*—Jacqueline J. Garner; Wade James Brady; Richard L. Donaldson

[57] ABSTRACT

The invention comprises an integrated circuit having both low voltage and high voltage MOS transistors and a method for making the integrated circuit. In accordance with the method of making the integrated circuit, a first oxide layer is formed outwardly from a semiconductor substrate comprising a low voltage region and a high voltage region. A sacrificial layer is formed outwardly from the first oxide layer. The part of the sacrificial layer disposed outwardly from the low voltage region is removed to form an intermediate structure. The intermediate structure is selectively etched to remove the part of the first oxide layer disposed outwardly from the low voltage region. A second oxide layer is then formed comprising a first area disposed outwardly from the low voltage region and second area disposed outwardly from the high voltage region. The formation of the second oxide layer in the second area consumes the sacrificial layer.

9 Claims, 1 Drawing Sheet

METHOD OF FORMING AN INTEGRATED CIRCUIT HAVING BOTH LOW VOLTAGE AND HIGH VOLTAGE MOS TRANSISTORS

This application claims priority under 35 USC § 119 (e) (1) of provisional application no. 60/062,627, filed Oct. 22, 1997.

TECHNICAL FIELD OF THE INVENTION

This invention relates generally to integrated circuits and more particularly to an integrated circuit having both low voltage and high voltage MOS transistors and a method for making such an integrated circuit.

BACKGROUND OF THE INVENTION

Some MOS integrated circuits have several types of MOS transistors that operate at different voltages. For example, an EEPROM may have high voltage MOS transistors for programming of the device and low voltage transistors making up the memory cells of the device. Another example of integrated circuits with both high and low voltage devices are integrated circuits designed to be compatible with older technologies. As the device size in MOS integrated circuits shrinks, the oxide thickness and operating voltage of MOS transistors internal to the device are reduced. To retain compatibility with older technologies, however, higher voltage transistors with thicker oxides may be used for input and/or output circuitry of the integrated circuit.

MOS integrated circuits having transistors with different operating voltages present certain problems in fabrication. To accomplish a variance in operating voltages, different transistors are fabricated with different gate oxide thicknesses. Higher voltage transistors have a thicker gate oxide. In a commonly used existing process, a gate oxide layer is initially formed, and then patterned and removed from the region of the integrated circuit that will have low voltage MOS transistors. The subsequent removal of photoresist that was used to mask and protect the area of the integrated circuit having high voltage transistors exposes the wafer (in many cases bare silicon) in the low voltage region to impurities in the photoresist and the chemicals used for removal of the photoresist. In addition, the photoresist cleanup results in gate oxide integrity problems in the high voltage region.

SUMMARY OF THE INVENTION

The invention comprises an integrated circuit having both low voltage and high voltage MOS transistors and a method of making such an integrated circuit. One aspect of the invention is a method of making an integrated circuit having both low voltage and high voltage MOS transistors. A first oxide layer is formed outwardly from a semiconductor substrate having a low voltage region and a high voltage region. A sacrificial layer is formed outwardly from the first oxide layer. The part of the sacrificial layer deposed outwardly from the low voltage region is then removed to form an intermediate structure comprising a portion or all of the first oxide layer. The intermediate structure is selectively etched to remove the part of the first oxide layer disposed outwardly from the low voltage region. A second oxide layer is then formed compromising a first area disposed outwardly from the low voltage region and a second area disposed outwardly from the high voltage region wherein formation of the second oxide layer in the second area consumes the sacrificial layer.

The invention has several important technical advantages. The use of a sacrificial layer to protect the oxide in the high voltage region during the etch of the oxide in the low voltage region avoids exposure of the bare silicon in the low voltage region to photoresist and the chemicals used for removal of photoresist following the oxide etch in the low voltage area. In addition, the sacrificial layer improves gate oxide integrity by preventing exposure of the first oxide layer in the high voltage layer to photoresist and the chemicals used for the removal of that resist.

The consumption of the sacrificial layer in the high voltage region to form the second oxide layer in the high voltage region results in a thin, high quality, CVD-like oxide. Accordingly, the gate oxide in the high voltage region of the integrated circuit acts like a stacked CVD-on-thermal oxide. Such a stacked gate oxide has low defect density, resulting in a higher yield for integrated circuits constructed in accordance with the teachings of the invention. The sacrificial layer can also be deposited at lower temperatures allowing for better control of layer thickness.

BRIEF DESCRIPTION OF THE DRAWINGS

For a more complete understanding of the present invention and the advantages thereof, reference is now made to the following descriptions, taken in conduction with the accompanying drawings in which.

DETAILED DESCRIPTION OF THE INVENTION

The preferred embodiment of the present invention and its advantages are best understood by referring to FIGS. 1A through 1F of the drawings, like numerals being used for like and corresponding parts of the various drawings.

FIGS. 1A–1F illustrate cross-sectional views of a portion of an integrated circuit 10 constructed in accordance with the teachings of the invention. The steps of fabricating integrated circuit 10 will be described with respect to these drawings.

Figure 1A:
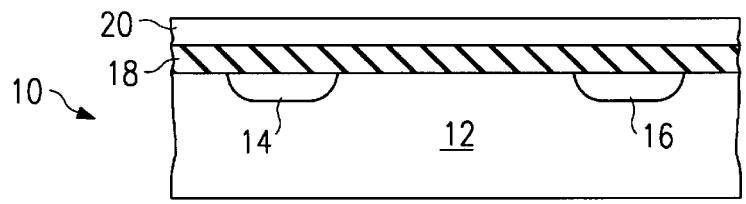
FIGS. 1A–1F illustrate cross-sectional diagrams of a portion of an integrated circuit constructed in accordance with the teachings of the invention.

FIG. 1A illustrates integrated circuit 10 after several processing steps have been performed. Integrated circuit 10 compromises substrate 12, channel region 14, channel region 16, first oxide layer 18 and sacrificial layer 20. Channel region 14 and channel region 16 may be formed in substrate 12 using existing techniques. Although shown alongside each other (for illustrative purposes), the two channel regions may be isolated by standard isolation techniques such as Shallow Trench Isolation (STI) or Local Oxidation of Silicon (LOCOS).

First oxide layer 18 is formed outwardly from semiconductor substrate 12. In this embodiment, first oxide layer 18 comprises a thermally grown thin oxide that is approximately 25 to 35 Å. Oxide layer 18 could also be a nitrided oxide. For purposes of this application, the term, "nitrided oxide" refers broadly to a nitrogen-containing oxide. In addition, oxide layer 18 could have a different thickness without departing from the scope of the invention. Also, some other method of forming oxide layer 18 such as deposition using a CVD process could be used without departing from the scope of the invention.

The sacrificial layer 20 comprises amorphous silicon. Sacrificial layer 20 is approximately 40 to 60 Å in thickness in this embodiment, but could be any thickness depending upon the final desired oxide thickness in the high voltage region of integrated circuit 10. Sacrificial layer 20 is deposited after formation of oxide layer 18. Although sacrificial layer 20 comprises amorphous silicon in this embodiment, any material could be used that survives the etch of oxide layer 18 as described below and is consumed during the formation of oxide layer 22 as also described below.

Figure 1B:
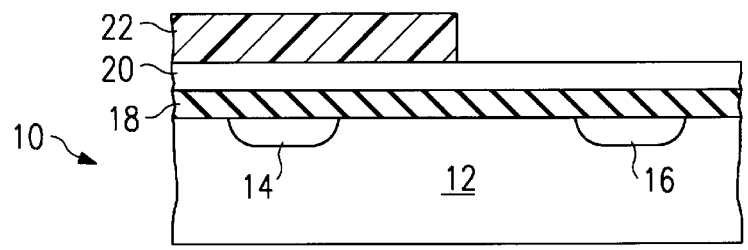

FIG. 1B illustrates the next step in the formation of integrated circuit 10. The low voltage region of integrated circuit 10 is patterned by forming a mask over sacrificial layer 20 in the high voltage region of integrated circuit 10. In this embodiment, the mask comprises photoresist layer 22 but could comprise any material. Integrated circuit 10, when completed, will have transistors with at least two different operating voltages. In this embodiment, integrated circuit 10 comprises a high voltage region and a low voltage region. The cross-section illustrated in FIGS. 1A through 1F is a cross-section taken from a border between the high voltage region and the low voltage region. Here, the high voltage region is represented by the left side of FIGS. 1A through 1F while the low voltage region is represented by the right-hand side of FIGS. 1A through 1F. Thus, in FIG. 1B, photoresist layer 22 masks the high voltage region of integrated circuit 10, leaving the low voltage region exposed.

Figure 1C:
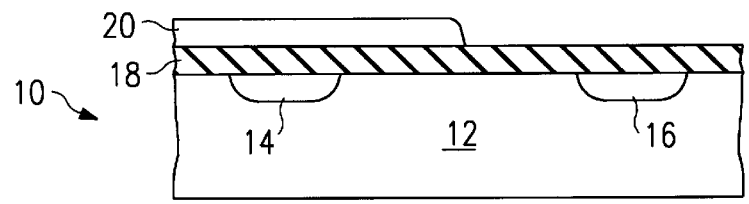

Next, as illustrated in FIG. 1C, sacrificial layer 20 is etched selectively with respect to oxide layer 18. Following the selective etch of sacrificial layer 20, photoresist layer 22 is removed, resulting in the structure illustrated in FIG. 1C. Accordingly, the portion of oxide layer 18 in the high voltage region of integrated circuit 10 is not exposed to photoresist or photoresist removal. Sacrificial layer 20 protects oxide layer 18 from such exposure.

Figure 1D:
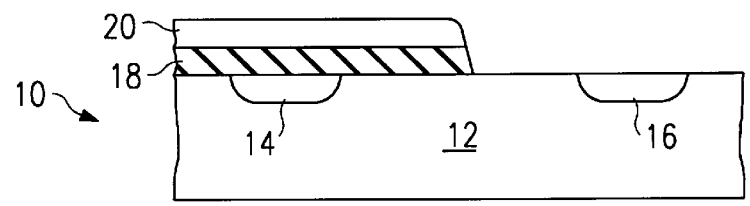
Figure 1E:
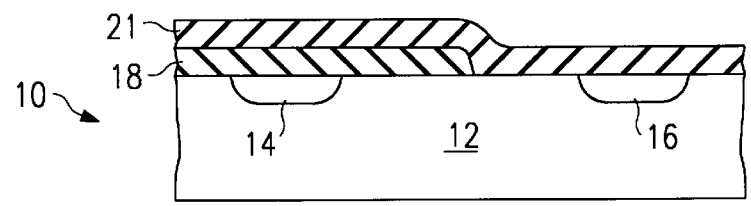

Next, as illustrated in FIG. 1D, oxide layer 18 is etched selectively with respect to silicon to remove oxide layer 18 in the low voltage region of integrated circuit 10. Again, sacrificial layer 20 protects the portion of oxide layer 18 in the high voltage region of integrated circuit 10.

Following the removal of oxide layer 18 from the low voltage region, oxide layer 21 is formed. In this embodiment, oxide layer 21 is thermally grown. The thermal growth of oxide layer 21 consumes sacrificial layer 20 in forming the portion of oxide layer 21 in the high voltage region of integrated circuit 10. In this embodiment, oxide layer 21 is 25 to 35 Å in thickness in the low voltage region but could be any thickness without departing from the scope of the invention. The thickness of oxide layer 21 in the high voltage region of integrated circuit 10 depends upon the thickness of sacrificial layer 20. Preferably, sacrificial layer 20 is completely consumed during the formation of oxide layer 21. The resulting gate oxide in the high voltage region of integrated circuit 10 comprises oxide layer 18 and oxide layer 21. This oxide acts as a stacked CVD-on-thermal oxide. Accordingly, the oxide in the high voltage region of integrated circuit 10 is a high quality oxide with low defect density, thus improving the manufacturing yield for integrated circuit 10. Second oxide layer 21 may also be a nitrided oxide.

Figure 1F:
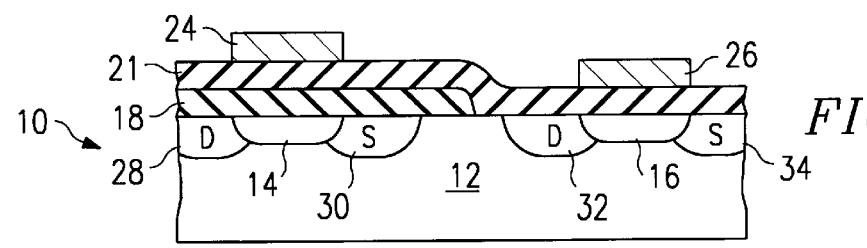

FIG. 1F shows a completed high voltage MOS transistor and a completed low voltage MOS transistor on integrated circuit 10. The high voltage transistor comprises gate 24, drain 28, source 30, channel region 14, and a gate oxide comprising first oxide layer 18 and second oxide layer 21. The low voltage MOS transistor comprises gate 26, drain 32, source 34, channel region 16, and a gate oxide comprising oxide layer 21. Again, high voltage transistors may be electrically isolated from the low-voltage transistors by standard isolation techniques.

Although the present invention has been described in detail, it should be understood that various changes, substitutions, and alterations can be made hereto without departing from the spirit and scope of the invention as defined by the appended claims.

What is claimed is:

1. A method of making an integrated circuit having both low voltage and high voltage MOS transistors, comprising:

forming a first oxide layer outwardly from a semiconductor substrate, the semiconductor substrate comprising a low voltage region and a high voltage region;

forming a sacrificial layer outwardly from the first oxide layer;

removing the part of the sacrificial layer disposed outwardly from the low voltage region to form an intermediate structure;

selectively etching the intermediate structure to remove the part of the first oxide layer disposed outwardly from the low voltage region;

forming a second oxide layer comprising a first area disposed outwardly from the low voltage region and a second area disposed outwardly from the high voltage region, wherein formation of the second oxide layer in the second area consumes the sacrificial layer.

2. The method of claim 1, further comprising:

forming a protective layer outwardly from the sacrificial layer and the high voltage region of the semiconductor substrate, the protective layer formed after formation of the sacrificial layer and operable to prevent removal of the part of the sacrificial layer disposed outwardly from the high voltage region during removal of the part of the sacrificial layer disposed outwardly from the low voltage region.

3. The method of claim 1, wherein the first oxide layer is thermally grown.

4. The method of claim 1, wherein the first oxide layer is deposited.

5. The method of claim 1, wherein the sacrificial layer comprises amorphous silicon.

6. The method of claim 1, wherein the first oxide layer comprises a nitrided oxide.

7. The method of claim 2, wherein the protective layer comprises a patterned layer of photoresist.

8. The method of claim 1, wherein the second oxide layer is thermally grown.

9. The method of claim 1, wherein the first and second oxide layers are thermally grown, and wherein the sacrificial layer comprises amorphous silicon.

* * * * *